(12) United States Patent
Lin et al.

(10) Patent No.: US 10,050,021 B1
(45) Date of Patent: Aug. 14, 2018

(54) DIE DEVICE, SEMICONDUCTOR DEVICE AND METHOD FOR MAKING THE SAME

(71) Applicant: NANYA TECHNOLOGY CORPORATION, Taoyuan (TW)

(72) Inventors: Po-Chun Lin, Changhua (TW); Chin-Lung Chu, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 15/434,569

(22) Filed: Feb. 16, 2017

(51) Int. Cl.
*H01L 25/00* (2006.01)
*H01L 25/065* (2006.01)
*H01L 23/00* (2006.01)

(52) U.S. Cl.
CPC .......... *H01L 25/0657* (2013.01); *H01L 24/11* (2013.01); *H01L 24/17* (2013.01); *H01L 24/32* (2013.01); *H01L 2224/1712* (2013.01); *H01L 2225/06513* (2013.01); *H01L 2225/06517* (2013.01); *H01L 2225/06544* (2013.01); *H01L 2924/0105* (2013.01)

(58) Field of Classification Search
CPC ..................................................... H01L 25/065
See application file for complete search history.

(56) References Cited

U.S. PATENT DOCUMENTS

| | | |
|---|---|---|
| 6,243,283 B1 | 6/2001 | Bertin |
| 2011/0074022 A1 | 3/2011 | Pendse |
| 2015/0061120 A1* | 3/2015 | Yang .................. H01L 25/0657 257/737 |
| 2017/0047270 A1* | 2/2017 | Lee ........................ H01L 23/481 |

OTHER PUBLICATIONS

Office Action dated Dec. 27, 2017 in corresponding TW Application No. 106115641 with partial English translation thereof, pp. 1-5.

* cited by examiner

*Primary Examiner* — William Harriston
(74) *Attorney, Agent, or Firm* — Muncy, Geissler, Olds & Lowe, P.C.

(57) ABSTRACT

A die device includes a die including an active layer; and an interconnect feature configured for electrical connection of the active layer, wherein the interconnect feature is in contact with a substrate in the die; and a bump, independent of the die, configured for electrical connection of the active layer.

15 Claims, 11 Drawing Sheets

DIE DEVICE, SEMICONDUCTOR DEVICE AND METHOD FOR MAKING THE SAME

TECHNICAL FIELD

The present disclosure relates to a semiconductor device, and more particularly, to a semiconductor device including stacked dies.

DISCUSSION OF THE BACKGROUND

The fabrication of modern circuits involves several steps. Integrated circuits are first fabricated on a semiconductor wafer, which contains multiple duplicated semiconductor chips, each comprising integrated circuits. The semiconductor chips are then cut from the wafer and packaged. The packaging processes have two main purposes: to protect delicate semiconductor chips, and to connect interior integrated circuits to exterior connections.

In packaging integrated circuit (IC) chips, solder joining is one of the commonly used methods for bonding IC chips to package substrates, which may or may not include integrated circuits or other passive components. During packaging processes, a semiconductor die or chip may be mounted on a package substrate using flip-chip bonding. The package substrate may be an interposer that includes metal connections for routing electrical signals between opposite sides. Other types of substrates may also be used. The die may be bonded to the substrate through direct metal bonding, solder bonding, or the like. There are many challenges in chip packaging.

This Discussion of the Background section is provided for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides a die device. The die device includes a die including an active layer; and an interconnect feature configured for electrical connection of the active layer, wherein the interconnect feature is in contact with a substrate in the die; and a bump, independent of the die, configured for electrical connection of the active layer.

In some embodiments, a melting point of the interconnect feature is lower than the melting point of copper.

In some embodiments, a material of the interconnect feature includes stannum (Sn).

In some embodiments, the bump is on the active layer of the die.

In some embodiments, the bump is on a first surface of the die, and the die device is free of another bump on a second surface of the die opposite to the first surface.

In some embodiments, the active layer is within the first surface of the die.

Another aspect of the present disclosure provides a semiconductor device, including a first die device including a first die including a first active layer; and a first interconnect feature configured for electrical connection of the first active layer; and a second die device including a second die including a second active layer; and a bump, independent of the second die, configured for electrical connection of the second active layer, wherein the bump is surrounded by the first interconnect feature.

In some embodiments, the bump is in contact with the first interconnect feature.

In some embodiments, the semiconductor device further includes an adhesive layer, by which the second die device is bonded to the first die device.

In some embodiments, the second die device is on the adhesive layer, and the adhesive layer is on the first die device.

In some embodiments, a distance between the first die device and the second die device is substantially the same as a thickness of the adhesive layer.

In some embodiments, a portion of the bump is surrounded by the first interconnect feature, and the remaining portion of the bump is surrounded by the adhesive feature.

In some embodiments, a melting point of the first interconnect feature is lower than that of copper.

In some embodiments, material of the first interconnect feature includes stannum (Sn).

In some embodiments, the bump is the second bump. The first die device further includes a first bump, independent of the first die, configured for electrical connection of the first active layer.

In some embodiments, the first bump is on a first surface of the first die, and the first die device is free of another bump on a second surface of the first die opposite to the first surface.

In some embodiments, the first active layer is within the first surface of the first die.

In some embodiments, the first bump is on the first active layer of the first die.

Another aspect of the present disclosure provides a method, including obtaining a first die device and a second die device by performing an operation twice, the operation including forming an active layer in and on a substrate; forming a bump on the active layer; forming a trench in the substrate, exposing the active layer; and forming a polished conductive layer in the trench and on the active layer; and inserting the bump of the second die device into the polished conductive layer of the first die device.

In some embodiments, the method further includes forming a melted-and-polished conductive layer by melting the polished conductive layer, wherein a melting point of the polished conductive layer is lower than that of copper.

In some embodiments, the inserting the bump of the second die device into the polished conductive layer of the first die device includes inserting the bump of the second die device into the melted-and-polished conductive layer of the first die device.

In the present disclosure, an interconnect feature of a die is in contact with a substrate. Because the interconnect feature is of a material other than copper, although the interconnect feature is in contact with the substrate, no copper diffusion issue arises. As such, no insulation layer is required to separate the interconnect feature and the substrate. Therefore, the semiconductor manufacturing process is relatively simple.

In contrast, in some existing semiconductor devices, the existing semiconductor device includes a first die including a through-silicon via of copper. The through-silicon via functions as an electrical connection of an active layer of the first die. If the through-silicon via were to contact a substrate of the first die, the copper of the through-silicon via would diffuse into the substrate, u) resulting in a leakage path in the substrate. In this way, the existing semiconductor devices may function abnormally. To prevent such problem, an isolation layer of the first die is placed between the through-silicon via and the substrate, thereby separating the through-silicon via from the substrate. For making the isolation layer, a manufacturing process is relatively complicated. Internal structures of the first die are substantially the same as that of the second die. As such, the second die exhibits the same problems as the first die.

Moreover, in the present disclosure, because no bump is required on a second surface of the first die device to function as an electrical connection of a first interconnect structure of a first die, and because a bump of a second die device, functioning as an electrical connection of a second active layer of a second die, is inserted into the first interconnect structure, a height of the semiconductor device of the present disclosure is relatively low. The semiconductor device of the present disclosure is therefore relatively compact.

In contrast, in some existing semiconductor devices, the existing semiconductor device includes a first die and a second die. The first die and the second die are bonded together through their bumps. In this way, there is a distance, resulting from the bumps, between the first die and the second die. Such distance creates an obstacle to reducing sizes of the existing semiconductor devices. Moreover, in order to couple the first die to the second die and a carrier substrate, respectively, two bumps are required for the first die. Making the two bumps requires a relatively complicated manufacturing process.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
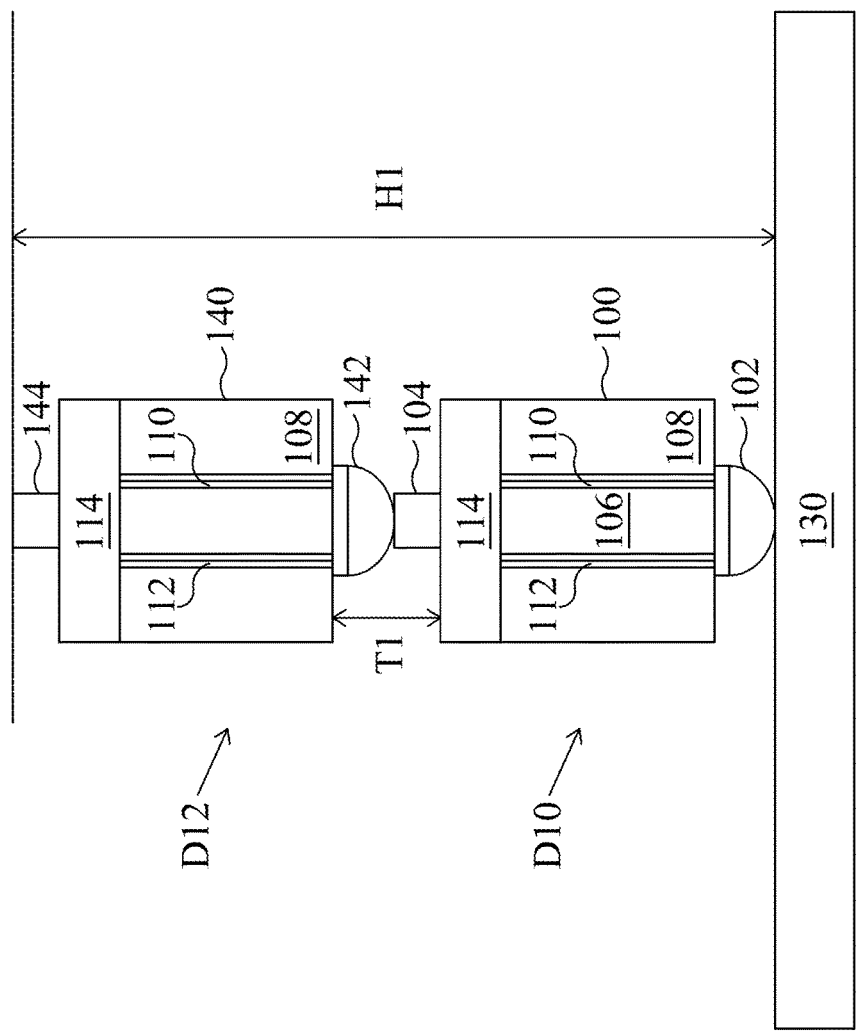
FIG. 1 is a schematic diagram of a semiconductor device, in accordance with a comparative embodiment of the present disclosure.

Embodiments, or examples, of the disclosure illustrated in the drawings are now described using specific language. It shall be understood that no limitation of the scope of the disclosure is thereby intended. Any alteration or modification to the described embodiments, and any further applications of principles described in this document, are to be considered as normally occurring to one of ordinary skill in the art to which the disclosure relates. Reference numerals may be repeated throughout the embodiments, but this does not necessarily require that feature(s) of one embodiment apply to another embodiment, even if they share the same reference numeral.

It shall be understood that when an element is referred to as being "connected to" or "coupled with" another element, it may be directly connected to or coupled to the other element, or intervening elements may be present.

It shall be understood that, although the terms first, second, third, etc. may be used herein to describe various elements, components, regions, layers or sections, these elements, components, regions, layers or sections should not be limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It shall be further understood that the terms "comprises" and "comprising," when used in this specification, specify the presence of stated features, integers, steps, operations, elements, or components, but do not preclude the presence or addition of one or more other features, integers, steps, operations, elements, components, or groups thereof.

FIG. 1 is a schematic diagram of a semiconductor device 10, in accordance with a comparative embodiment of the present disclosure. Referring to FIG. 1, the semiconductor device 10 includes a first die device D10, a second die device D12 and a carrier substrate 130.

The first die device D10 includes a first die 100, a first bump 102 on a first surface of the first die 100 and a second bump 104 on a second surface of the first die 100. The second die device D12 includes a second die 140, a third bump 142 on a first surface of the second die 140 and a fourth bump 144 on a second surface of the second die 140.

The first die 100 and the second die 140 are bonded together through their second bump 104 and third bump 142. In this way, there is a distance T1, resulting from the second bump 104 and the third bump 142, between the first die 100 and the second die 140. The distance T1 is an obstacle to reducing the size of the semiconductor device 10. For example, a height H1 of the semiconductor device 10 is relatively large. Moreover, to couple the first die 100 to the second die 140 and the carrier substrate 130, two bumps, the first bump 102 and the second bump 104, are required for the first die 100. Making the two bumps 102 and 104 requires a relatively complicated manufacturing process.

The first die 100 includes a through-silicon via 106 of copper, and a seed layer 110. The through-silicon via 106 functions as an electrical connection of an active layer 114 of the first die 100. If the through-silicon via 106 were to contact a substrate 108 of the first die 100, the copper of the through-silicon via 106 would diffuse into the substrate 108, resulting in a leakage path in the substrate 108. In this way, the semiconductor device 10 may function abnormally. To prevent such problem, an isolation layer 112, or called a liner, of the first die 100 is placed between the through-silicon via 106 and the substrate 108, thereby separating the through-silicon via 106 from the substrate 108. Making the isolation layer 112 requires a relatively complicated manufacturing process. An internal structure of the first die 100 is substantially the same as that of the second die 140. As such, the second die 140 exhibits the same problems as the first die 100.

Figure 2:
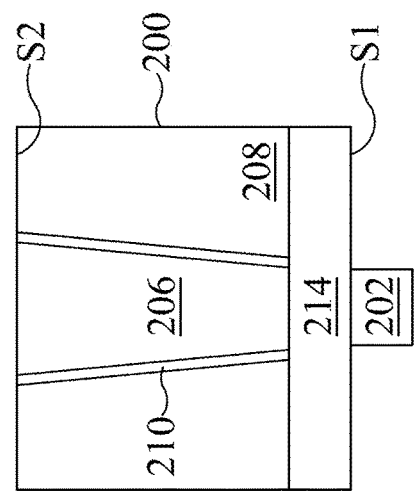
FIG. 2 is a schematic diagram of a die device, in accordance with an exemplary embodiment of the present disclosure.

FIG. 2 is a schematic diagram of a die device 20, in accordance with an exemplary embodiment of the present disclosure. Referring to FIG. 2, the die device 20 includes a die 200 and a bump 202 on the die 200. In an embodiment, the die 200 may be a logic die (e.g., central processing unit, microcontroller, etc.), a memory die (e.g., dynamic random access memory (DRAM) die, static random access memory (SRAM) die, etc.), a power management die (e.g., a power management integrated circuit (PMIC) die), a radio frequency (RF) die, a sensor die, a micro-electro-mechanical-system (MEMS) die, a signal process die (e.g., digital signal processing (DSP) die), a front-end die (e.g., analog front-end (AFE) die), the like, or a combination thereof.

The die 200 includes an active layer 214 and an interconnect feature 206. The active layer 214 includes an active region (not shown) where a channel of a transistor is defined. Moreover, the active layer 214 further includes interconnects configured for interconnection of the transistor, such as via, a metal-1 layer and a metal-2 layer.

The interconnect feature 206 functions as an electrical connection of the active layer 214. The interconnect feature 206 is in contact with a substrate 208 in the die 200. In an embodiment, the substrate 208 includes a wafer over which devices such as semiconductor devices or other devices are to be formed. In some embodiments, the substrate 208 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 208 includes a multilayered substrate, such as a silicon-on-insulator (SOI) substrate, which includes a bottom semiconductor layer, a buried oxide layer (BOX) and a top semiconductor layer.

In another embodiment, the substrate 208 may be a p type doped substrate, or an n type doped substrate, which means that the semiconductor substrate 208 may be doped with either n type or p type impurities. The substrate 208 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 208.

As depicted in FIG. 2, it appears that the interconnect feature 206 is separate from the substrate 208 by a seed layer 210 of the die 200. However, material of the interconnect feature 206 is substantially the same as that of the seed layer 210. The application of the seed layer 210 is for forming the interconnect feature 206. As such, the seed layer 210 can be deemed as a part of the interconnect feature 206, and therefore the interconnect feature 206 can be deemed as being in contact with the substrate 208.

Moreover, the interconnect feature 206 is of a material other than copper. Therefore, although the interconnect feature 206 is in contact with the substrate 208, no copper diffusion issue arises. As such, no insulation layer, such as a liner, is required to separate the interconnect feature 206 and the substrate 208. Therefore, the semiconductor manufacturing process is relatively simple. In an embodiment, a melting point of the interconnect feature 206 is lower than the melting point of copper. In an embodiment, a material of the interconnect feature 206 includes stannum (Sn).

The bump 202, independent of the die 200, functions as an electrical connection of the active layer 214. Moreover, the bump 202 is on the active layer 214 within a first surface S1 of the die 200. In further detail, the bump 202 is on the first surface S1 of the die 200, and the die device 20 is free of another bump, which would be required in existing semiconductor devices, on a second surface S2 of the die 200 opposite to the first surface S1.

Figure 3:
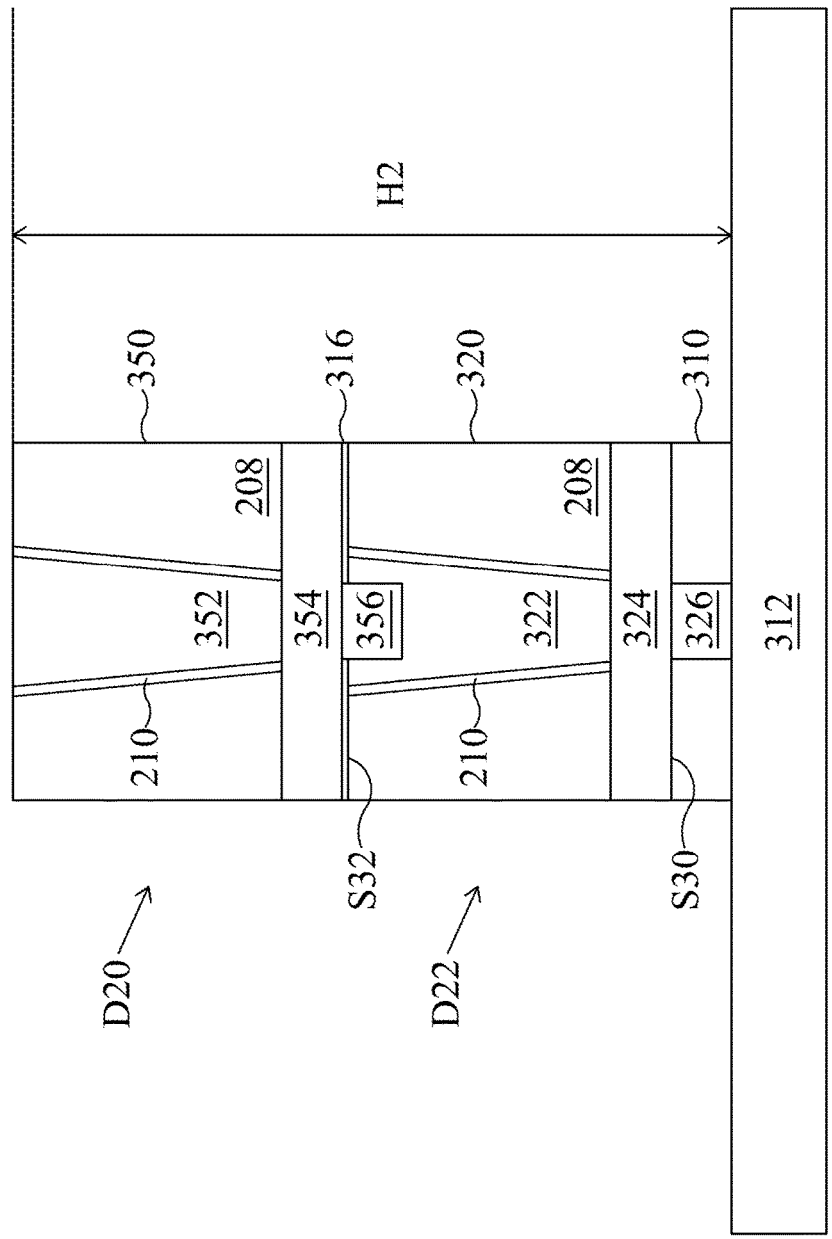
FIG. 3 is a schematic diagram of a semiconductor device, in accordance with an exemplary embodiment of the present disclosure.

FIG. 3 is a schematic diagram of a semiconductor device 30, in accordance with an exemplary embodiment of the present disclosure. Referring to FIG. 3, the semiconductor device 30 includes a first die device D20, a second die device D22, a first adhesive layer 310, a second adhesive layer 316 and a carrier substrate 312. Each of the first die device D20 and the second die device D22 has the same structure and function as the die device 20 described and illustrated with reference to FIG. 2. Accordingly, some detailed descriptions are omitted herein.

The first die device D20 is bonded to the carrier substrate 312 via the first adhesive layer 310. The second die vice D22 is bonded to the first die device D20 via the second adhesive layer 316. In further detail, the second die device D22 is on the second adhesive layer 316, and the second adhesive layer 316 is in turn on the first die device D20.

The first die device D20 includes a first die 320 and a first bump 326. In an embodiment, the first die 320 may be a logic die (e.g., central processing unit, microcontroller, etc.), a memory die (e.g., dynamic random access memory (DRAM) die, static random access memory (SRAM) die, etc.), a power management die (e.g., a power management integrated circuit (PMIC) die), a radio frequency (RF) die, a sensor die, a micro-electro-mechanical-system (MEMS) die, a signal process die (e.g., digital signal processing (DSP) die), a front-end die (e.g., analog front-end (AFE) die), the like, or a combination thereof.

The first die 320 includes a first active layer 324 and a first interconnect feature 322. The first interconnect feature 322 functions as an electrical connection of the first active layer 324. In an embodiment, a melting point of the first interconnect feature 322 is lower than that of copper. In an embodiment, a material of the first interconnect feature 322 includes stannum (Sn).

The first bump 326, independent of the first die 320 and on the first active layer 324 of the first die 320, functions as an electrical connection of the first active layer 324. The first bump 326 is on a first surface S30 of the first die 320. However, the first die device D20 is free of another bump, functioning as an electrical connection of the first interconnect feature 322, on a second surface S32 of the first die 320 opposite to the first surface S30. In further detail, the first active layer 324 is within the first surface S30 of the first die 320.

The second die device D22 includes a second die 350 and a second bump 356. In an embodiment, the second die 350 may be a logic die (e.g., central processing unit, microcontroller, etc.), a memory die (e.g., dynamic random access memory (DRAM) die, static random access memory (SRAM) die, etc.), a power management die (e.g., a power management integrated circuit (PMIC) die), a radio frequency (RF) die, a sensor die, a micro-electro-mechanical-system (MEMS) die, a signal process die (e.g., digital signal processing (DSP) die), a front-end die (e.g., analog front-end (AFE) die), the like, or a combination thereof.

The second die 350 includes a second active layer 354 and a second interconnect feature 352. The second interconnect feature 352 functions as an electrical connection of the second active layer 354. In an embodiment, a melting point of the second interconnect feature 352 is lower than that of copper. In an embodiment, a material of the second interconnect feature 352 includes stannum (Sn).

The second bump 356, independent of the second die 350, functions as an electrical connection of the second active layer 354. The second bump 356, in the first interconnect feature 322, is surrounded by the first interconnect feature 322 and is in contact with the first interconnect feature 322. In further detail, a portion of the second bump 356 is surrounded by the first interconnect feature 322, and the remaining portion of the second bump 356 is surrounded by the second adhesive feature 316. A distance between the first die device D20 and the second die device D22 is substantially the same as a thickness of the second adhesive layer 316. For illustration, the thickness of the second adhesive layer 316 depicted in FIG. 3 is exaggerated. The second adhesive layer 316 is extremely thin. Accordingly, no gap exists between the first die device D20 and the second die device D22.

In the present disclosure, because no bump is required on the second surface S32 of the first die device D20 to function as an electrical connection of the first interconnect structure 322, and because the second bump 356 of the second die device D22 is surrounded by the first interconnect structure 322, a height H2 of the semiconductor device 30 is relatively low. The semiconductor device 30 is therefore relatively compact.

Moreover, as stated in the description of FIG. 2, in an embodiment, each of the first interconnect feature 322 and the second interconnect feature 352 is of a material other than copper. Therefore, although the first interconnect feature 322 and the second interconnect feature 352 are in contact with substrates 208 of the first die device D20 and the second die device D22, respectively, no copper diffusion issue arises. As a result, no insulation layer functioning to separate the first interconnect feature 322 from the substrate 208, and to separate the second interconnect feature 352 from the substrate 208, is required.

Figure 4:
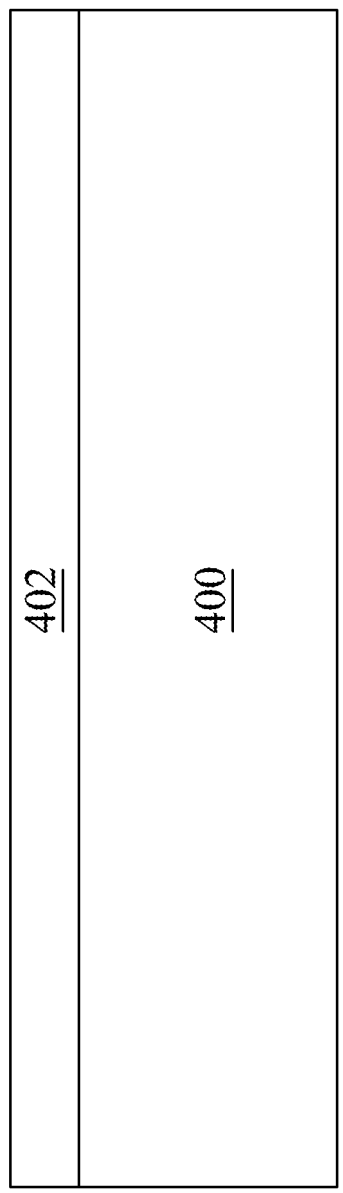
FIGS. 4 to 11 are cross-sectional views during various operations of manufacturing a semiconductor device according to some embodiments of the present disclosure.

FIGS. 4 to 11 are cross-sectional views during various operations of manufacturing a semiconductor device according to some embodiments of the present disclosure. Referring to FIG. 4, a substrate 400 is provided. Subsequently, an active layer 402 is formed in and on the substrate 400.

Figure 5:
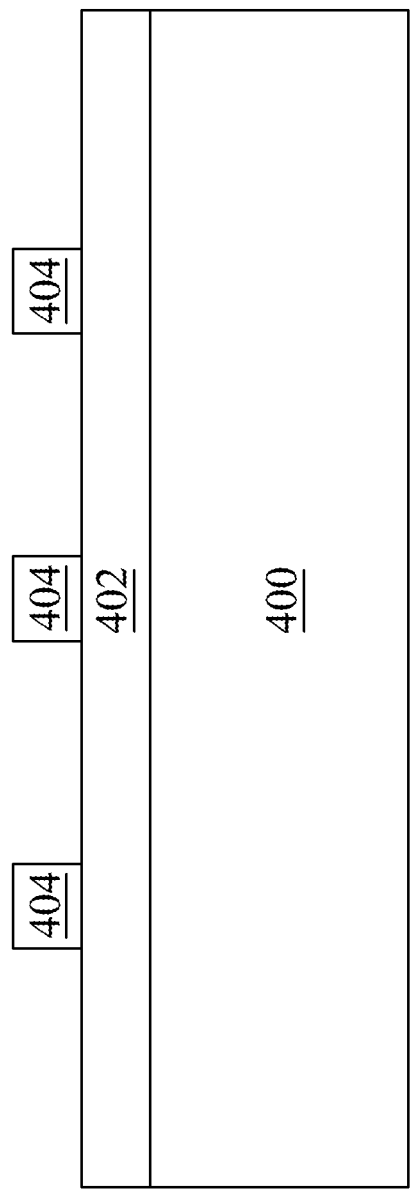
Figure 6:
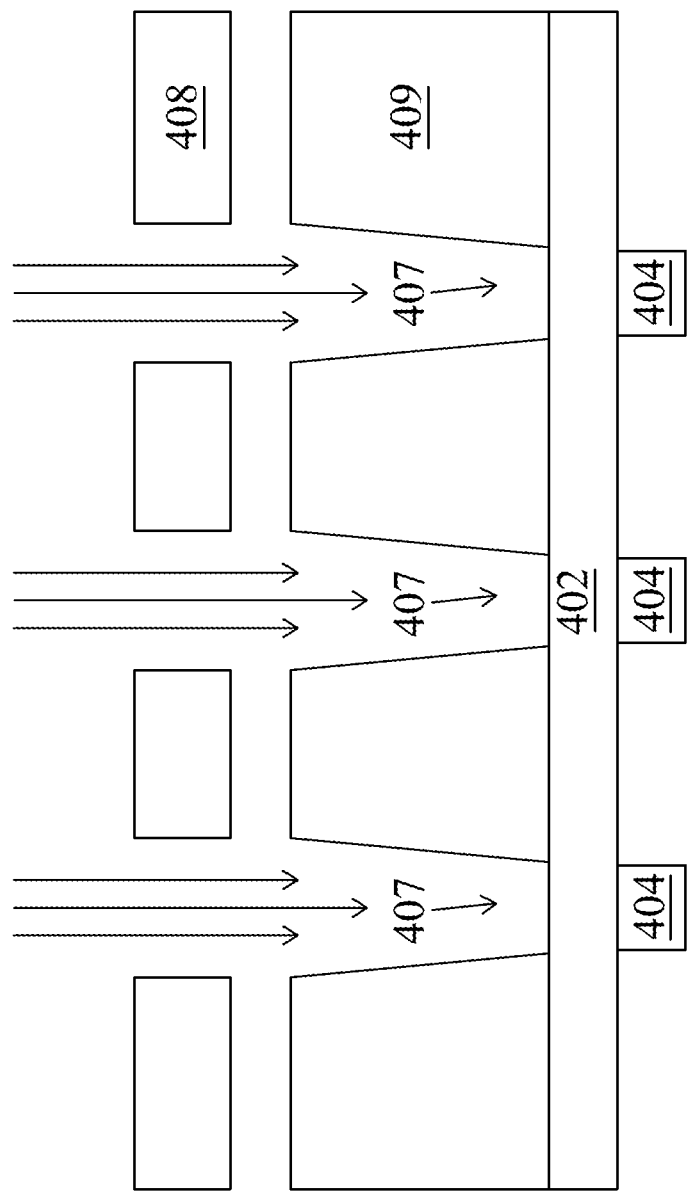

Referring to FIG. 5, bumps 404 are formed on the active layer 402. Referring to FIG. 6, the resultant substrate 409 having trenches 407 is formed by using a pattered mask 408 as a mask to pattern the substrate 400. As such, a portion of the active layer 402 is exposed.

Figure 7:
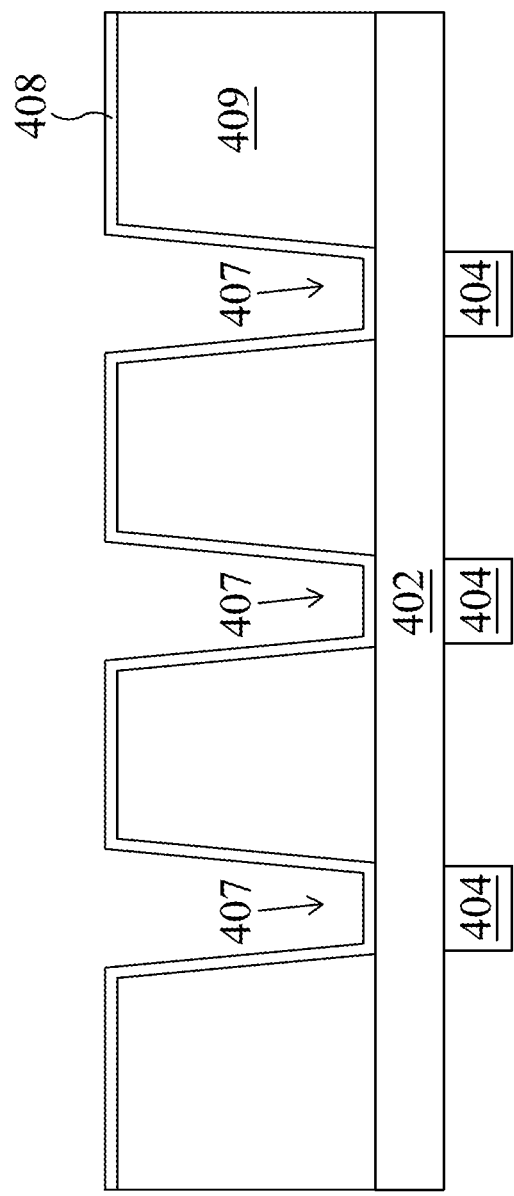

Referring to FIG. 7, a seed layer 408 is conformally formed on the resultant substrate 409 and the exposed portion of the active layer 402. In an embodiment, before the formation of the seed layer 408, an insulation layer is conformally formed on the resultant substrate 409 and the exposed portion of the active layer 402 by, for example, a deposition operation. Subsequently, the seed layer 408 is formed on the insulation layer.

Figure 8:
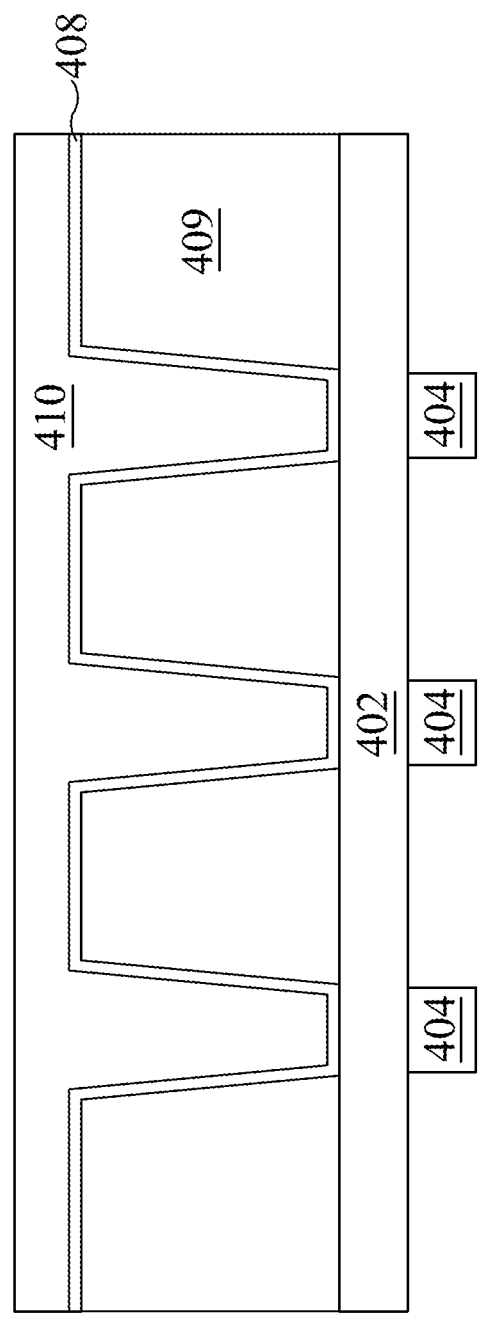
Figure 9:
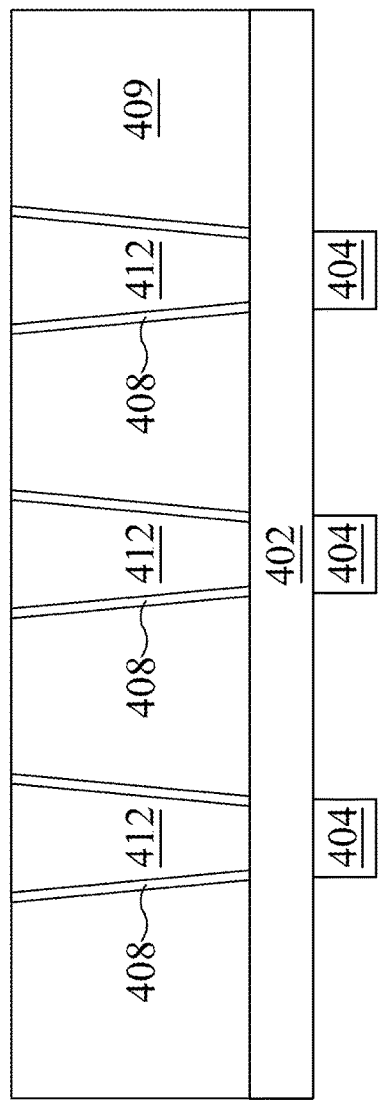

Referring to FIG. 8, a conductive layer 410 is formed on the seed layer 408 by, for example, a plating operation including either electroless plating and electro plating, or a combination thereof. Referring to FIG. 9, a polished conductive layer 412 is formed in the trench 407 and over the active layer 402 by polishing the conductive layer 410. Moreover, a portion of the seed layer 408 on a surface of the resultant substrate 409 is also removed. The resultant structure shown in FIG. 9 includes a structure of a die device of the present disclosure. Accordingly, a first die device D50 and a second die device D52 are each obtained by performing an operation illustrated and described with reference to FIGS. 4 to 9.

Figure 10:
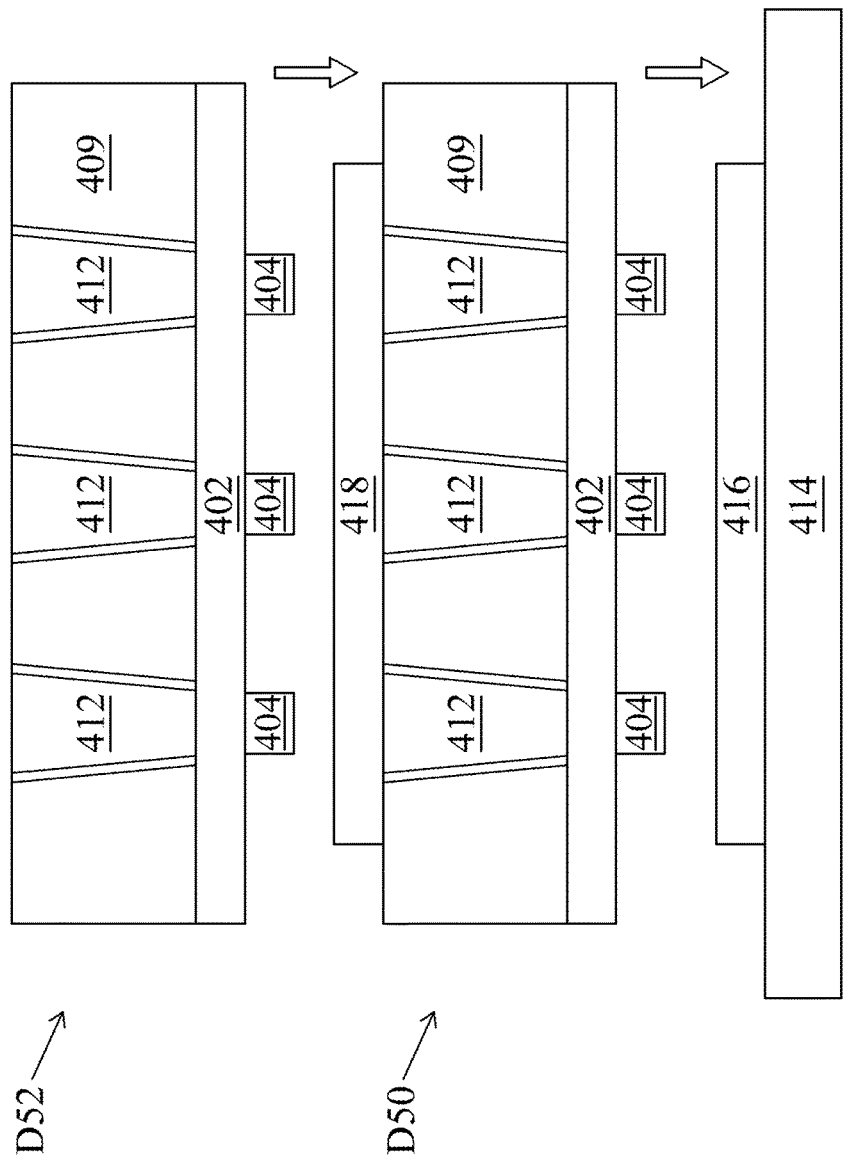
Figure 11:
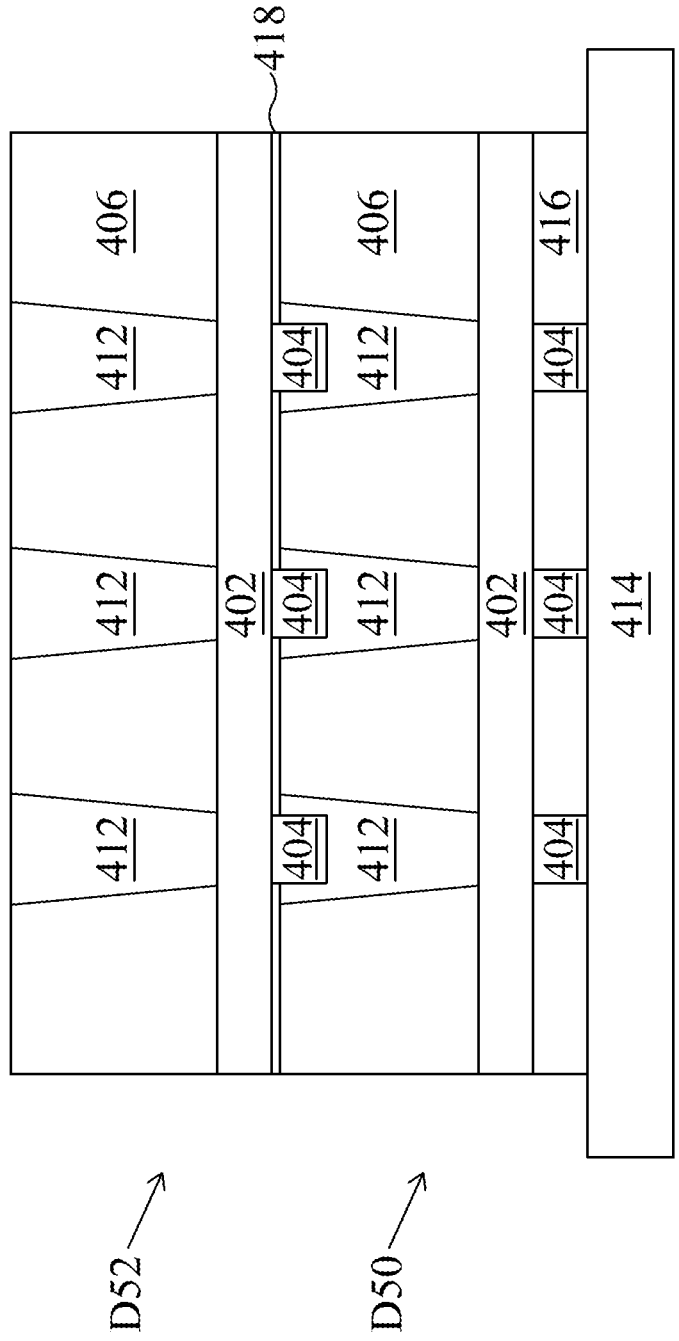

Referring to FIG. 10, a carrier wafer 414 is provided. A first adhesive layer 416 is formed on the carrier wafer 414, and a second adhesive layer 418 is formed on the resultant substrate 409 and the polished conductive layer 412 of the first die device D50. Referring to FIG. 11, bumps 404 of the second die device D52 are inserted into the polished conductive layer 412 of the first die device D50.

In an embodiment, referring back to FIG. 10, a melted-and-polished conductive layer is formed by melting the polished conductive layer 412. A melting point of the polished conductive layer 412 is lower than the melting point of copper. In further detail, in a chamber making the semiconductor device, a temperature is elevated higher than a melting point of the polished conductive layer 412 while lower than that of copper. Subsequently, bumps 404 of the second die device D52 are inserted into the melted-and-polished conductive layer of the first die device D50.

In the present disclosure, the interconnect feature 206 shown in FIG. 2 is of a material other than copper. Therefore, although the interconnect feature 206 is in contact with the substrate 208, no copper diffusion issue arises. As such, no insulation layer is required to separate the interconnect feature 206 and the substrate 208, and the semiconductor manufacturing process is simplified.

Moreover, in the present disclosure, since no bump is required on the second surface S32 of the first die device D20 to function as an electrical connection of the first interconnect structure 322, and since the second bump 356 of the second die device D22 is inserted into the first interconnect structure 322, a height H2 of the semiconductor device 30 is relatively low, and the semiconductor device 30 is therefore relatively compact.

One aspect of the present disclosure provides a die device. The die device includes a die including an active layer; and an interconnect feature configured for electrical connection of the active layer, wherein the interconnect feature is in contact with a substrate in the die; and a bump, independent of the die, is configured for electrical connection of the active layer.

Another aspect of the present disclosure provides a semiconductor device, including a first die device including a first die including a first active layer; and a first interconnect feature configured for electrical connection of the first active layer; and a second die device including a second die including a second active layer; and a bump, independent of the second die, configured for electrical connection of the second active layer, wherein the bump is surrounded by the first interconnect feature.

Another aspect of the present disclosure provides a method, including obtaining a first die device and a second die device by performing an operation twice, the operation including forming an active layer in and on a substrate; forming a bump on the active layer; forming a trench in the substrate, exposing the active layer; and forming a polished conductive layer in the trench and on the active layer; and inserting the bump of the second die device into the polished conductive layer of the first die device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a first die device including:
      a first die including:
         a first active layer; and
         a first interconnect feature configured for electrical connection of the first active layer; and
   a second die device including:
      a second die including:
         a second active layer; and
      a bump, independent of the second die, configured for electrical connection of the second active layer, wherein the bump is surrounded by the first interconnect feature.

2. The semiconductor device of claim 1, wherein the bump is in contact with the first interconnect feature.

3. The semiconductor device of claim 2, further comprising:
   an adhesive layer by which the second die device is bonded to the first die device.

4. The semiconductor device of claim 3, wherein the second die device is on the adhesive layer, and the adhesive layer is on the first die device.

5. The semiconductor device of claim 3, wherein a distance between the first die device and the second die device is substantially the same as a thickness of the adhesive layer.

6. The semiconductor device of claim 3, wherein a portion of the bump is surrounded by the first interconnect feature, and the remaining portion of the bump is surrounded by the adhesive feature.

7. The semiconductor device of claim 1, wherein a melting point of the first interconnect feature is lower than that of copper.

8. The semiconductor device of claim 1, wherein a material of the first interconnect feature includes stannum (Sn).

9. The semiconductor device of claim 1, wherein the bump is the second bump, the first die device further including:
   a first bump, independent of the first die, configured for electrical connection of the first active layer.

10. The semiconductor device of claim 9, wherein the first bump is on a first surface of the first die, and the first die device is free of another bump on a second surface of the first die opposite to the first surface.

11. The semiconductor device of claim 10, wherein the first active layer is within the first surface of the first die.

12. The semiconductor device of claim 10, wherein the first bump is on the first active layer of the first die.

13. A method, comprising:
   obtaining a first die device and a second die device by performing an operation twice, the operation including:
      forming an active layer in and on a substrate;
      forming a bump on the active layer;
      forming a trench in the substrate, exposing the active layer; and
      forming a polished conductive layer in the trench and on the active layer; and
   inserting the bump of the second die device into the polished conductive layer of the first die device.

14. The method of claim 13, further comprising:
   forming a melted-and-polished conductive layer by melting the polished conductive layer, wherein a melting point of the polished conductive layer is lower than that of copper.

15. The method of claim 13, wherein the inserting the bump of the second die device into the polished conductive layer of the first die device includes:
   inserting the bump of the second die device into the melted-and-polished conductive layer of the first die device.

* * * * *